United States Patent
Nishizawa et al.

(10) Patent No.: US 12,418,737 B2
(45) Date of Patent: Sep. 16, 2025

(54) IMAGE SENSOR CAPABLE OF ADDING PIXEL SIGNALS, CONTROL METHOD THEREOF, AND ELECTRONIC APPARATUS

(71) Applicant: CANON KABUSHIKI KAISHA, Tokyo (JP)

(72) Inventors: Hideta Nishizawa, Tokyo (JP); Hitoshi Nasu, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 167 days.

(21) Appl. No.: 18/356,373

(22) Filed: Jul. 21, 2023

(65) Prior Publication Data

US 2024/0040284 A1    Feb. 1, 2024

(30) Foreign Application Priority Data

Jul. 27, 2022  (JP) ................................. 2022-119835

(51) Int. Cl.
| | |
|---|---|
| *H04N 25/78* | (2023.01) |
| *H03M 1/12* | (2006.01) |
| *H04N 25/60* | (2023.01) |
| *H04N 25/772* | (2023.01) |

(52) U.S. Cl.
CPC ............ *H04N 25/78* (2023.01); *H03M 1/124* (2013.01); *H04N 25/60* (2023.01); *H04N 25/772* (2023.01)

(58) Field of Classification Search
CPC ...... H04N 25/78; H04N 25/772; H04N 25/60; H04N 25/616; H03M 1/124
See application file for complete search history.

(56) References Cited

U.S. PATENT DOCUMENTS

2017/0374307 A1* 12/2017 Kim ...................... H04N 25/616
2021/0044772 A1*  2/2021 Hung .................... H04N 25/65

FOREIGN PATENT DOCUMENTS

| JP | 4807440 B2 | 11/2011 |
|---|---|---|
| JP | 2020-191543 A | 11/2020 |

\* cited by examiner

*Primary Examiner* — Nicholas G Giles
(74) *Attorney, Agent, or Firm* — Cowan, Liebowitz & Latman, P.C.

(57) ABSTRACT

An image sensor comprises: a plurality of sample-and-hold circuits that sample and hold a plurality of signals input from a plurality of different pixels; a plurality of converters that convert the signals held in the plurality of sample-and-hold circuits to currents corresponding to potentials of the signals, respectively; a switch that connects/disconnects the plurality of converters; and a plurality of output circuits wherein, in a case where the switch connects the plurality of converters, the currents converted by the plurality of converters are added and output from one of the plurality of output circuits, and, in a case where the switch disconnects the plurality of converters, the currents converted by the plurality of converters are output from the plurality of output circuits, respectively.

12 Claims, 9 Drawing Sheets

IMAGE SENSOR CAPABLE OF ADDING PIXEL SIGNALS, CONTROL METHOD THEREOF, AND ELECTRONIC APPARATUS

BACKGROUND OF THE INVENTION

Field of the Invention

The present invention relates to an image sensor, control method thereof, and electronic apparatus, and more particularly to a technique for adding pixel signals within the image sensor.

Description of the Related Art

Conventionally, as a configuration for reading a signal from each pixel of an image sensor, there is a configuration in which a signal is sequentially output to a vertical output line shared by a plurality of pixels in the same column, and which has a sample-and-hold unit that stores in a capacitor a signal corresponding to a change in the voltage of the vertical output line due to the output signal. This sample-and-hold unit samples and holds a reset signal and an optical signal, and outputs the potential of the difference between these signals as a signal from the image sensor as it is, or outputs it after performing analog/digital (A/D) conversion inside the image sensor.

Japanese Patent No. 4807440 discloses a structure having a circuit for charging and holding the voltage of a pixel output signal by a sample-and-hold circuit.

However, the Japanese Patent No. 4807440 outputs a sampled and held signal of each pixel as it is, and does not describe a method of adding signals of a plurality of pixels in the horizontal or vertical direction. Further, although it is possible to convert the signal of each pixel into a digital signal and then add the digital signals, in that case, the power consumed in the image sensor cannot be reduced.

SUMMARY OF THE INVENTION

The present invention has been made in consideration of the above situation, and adds signals of a plurality of pixels in an image sensor while suppressing the influence of noise and reducing power consumption.

According to the present invention, provided is an image sensor comprising: a plurality of sample-and-hold circuits that sample and hold a plurality of signals input from a plurality of different pixels; a plurality of converters that convert the signals held in the plurality of sample-and-hold circuits to currents corresponding to potentials of the signals, respectively; a switch that connects/disconnects the plurality of converters; and a plurality of output circuits wherein, in a case where the switch connects the plurality of converters, the currents converted by the plurality of converters are added and output from one of the plurality of output circuits, and, in a case where the switch disconnects the plurality of converters, the currents converted by the plurality of converters are output from the plurality of output circuits, respectively.

Further, according to the present invention, provided is an electronic apparatus comprising: an image sensor comprising: a plurality of sample-and-hold circuits that sample and hold a plurality of signals input from a plurality of different pixels; a plurality of converters that convert the signals held in the plurality of sample-and-hold circuits to currents corresponding to potentials of the signals, respectively; a switch that connects/disconnects the plurality of converters; and a plurality of output circuits wherein, in a case where the switch connects the plurality of converters, the currents converted by the plurality of converters are added and output from one of the plurality of output circuits, and, in a case where the switch disconnects the plurality of converters, the currents converted by the plurality of converters are output from the plurality of output circuits, respectively; and a processor that processes the signal output from the image sensor.

Furthermore, according to the present invention, provided is a control method of an image sensor comprising: controlling a plurality of sample-and-hold circuits to hold a plurality of signals input from a plurality of different pixels; controlling a plurality of converters to convert the signals held in the plurality of sample-and-hold circuits to currents corresponding to potentials of the signals, respectively; controlling a switch to connect/disconnect the plurality of converters; and controlling, in a case where the switch connects the plurality of converters, to add and output the currents converted by the plurality of converters, and, in a case where the switch disconnects the plurality of converters, to output the currents converted by the plurality of converters independently.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Figure 1:
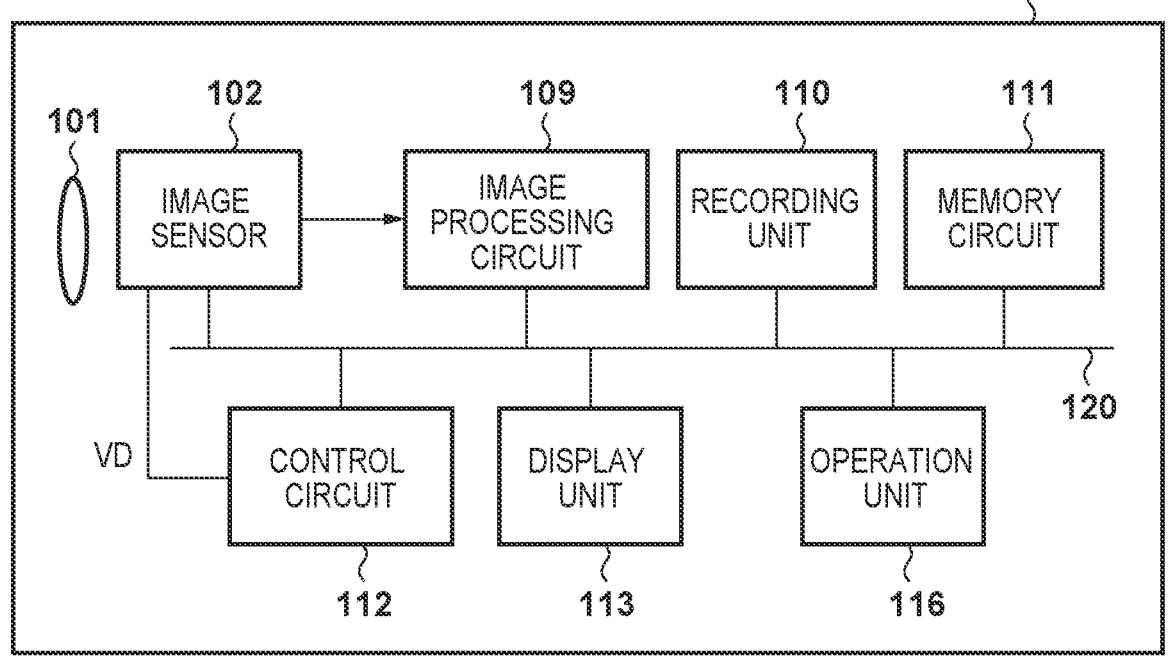
FIG. 1 is a block diagram showing a schematic configuration of an image capturing apparatus according to an embodiment of the present invention.

Hereinafter, embodiments will be described in detail with reference to the attached drawings. Note, the following embodiments are not intended to limit the scope of the claimed invention, and limitation is not made to an invention that requires a combination of all features described in the embodiments. Two or more of the multiple features described in the embodiments may be combined as appropriate. Furthermore, the same reference numerals are given to the same or similar configurations, and redundant description thereof is omitted.

First Embodiment

[Configuration of Apparatus]

FIG. 1 is a block diagram showing a schematic configuration of an image capturing apparatus 100 according to an embodiment of the present invention.

A lens unit 101 is composed of, for example, a plurality of lenses, diaphragms, etc., and condenses light from a subject and causes it to enter an image sensor 102. The image sensor 102 photoelectrically converts incident light and outputs image data.

An image processing circuit 109 performs development processing such as color matrix processing and gamma processing on image data output from the image sensor 102. In these processes, the image processing circuit 109 causes a memory circuit 111 to hold image data as needed. The image processing circuit 109 then outputs the processed image data to a display unit 113 and/or a recording unit 110.

The display unit 113 displays image data processed by the image processing circuit 109 and other information such as shooting parameters. The display unit 113 may configure an operation unit 116 together with a touch panel, in which case an image corresponding to the operation state is displayed. The recording unit 110 records image data processed by the image processing circuit 109, information attached to the image data, and the like in a storage medium (not shown).

The operation unit 116 is composed of one or a combination of switches, dials, a touch panel, a pointing device based on line-of-sight detection, a voice recognition device, etc., and is used by the user to input various operation instructions to the image capturing apparatus 100. The operation unit 116 then generates an operation signal according to the user's operation and outputs it to a control circuit 112.

The control circuit 112 controls image processing by the image processing circuit 109 and part of actuation of the image sensor 102. It also performs control corresponding to the operation signal input from the operation unit 116 and controls data transfer to/from the memory circuit 111, display unit 113, and recording unit 110. At least part of the functions of the control circuit 112 may be performed by the image sensor 102 or the image processing circuit 109.

A bus 120 is a common path through which the control circuit 112, the image sensor 102, the image processing circuit 109, the display unit 113, the operation unit 116, the recording unit 110, and the memory circuit 111 exchange data with each other.

Although the image capturing apparatus 100 is illustrated as including the lens unit 101 in FIG. 1, the lens unit 101 may be configured so as to be detachable from the image capturing apparatus 100.

Figure 2:
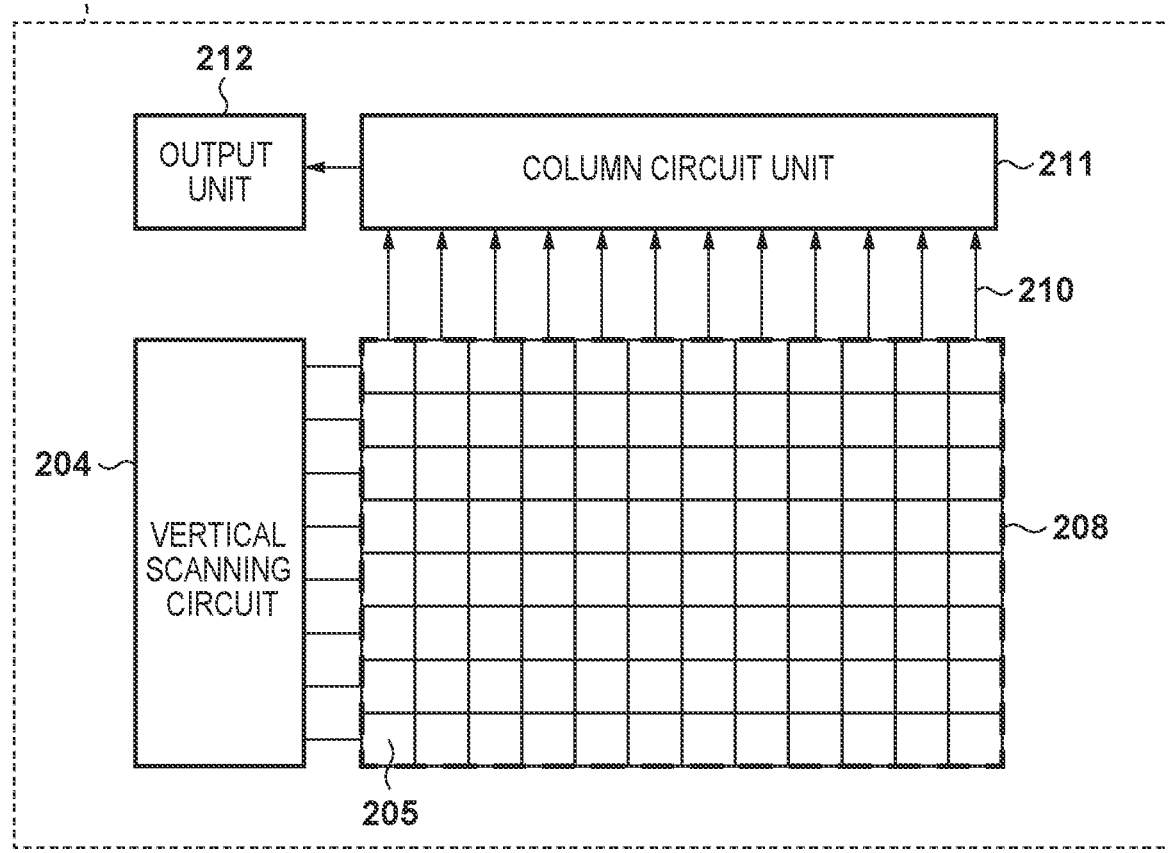
FIG. 2 is a schematic configuration diagram of an image sensor according to an embodiment.

FIG. 2 is a schematic configuration diagram of the image sensor 102.

The image sensor 102 has a pixel section 208 in which a plurality of pixels 205 are arranged in two dimensions. In this embodiment, in the pixel section 208, the pixels 205 are arranged in a plurality of rows in the vertical direction and in a plurality of columns in the horizontal direction. That is, the pixels 205 are arranged in a matrix. A vertical scanning circuit 204 has a configuration for outputting various control signals necessary for reading out signals to the pixels 205, and selects a pixel row from which signals are to be read out.

Signals read from the pixels 205 in the row selected by the vertical scanning circuit 204 are output to the vertical output lines 210 of respective columns and input to a column circuit unit 211. The column circuit unit 211 performs processing such as amplification and A/D conversion of pixel signals to generate image data. An output unit 212 sequentially outputs the image data generated by the column circuit unit 211 to the outside of the image sensor 102.

Figure 3:
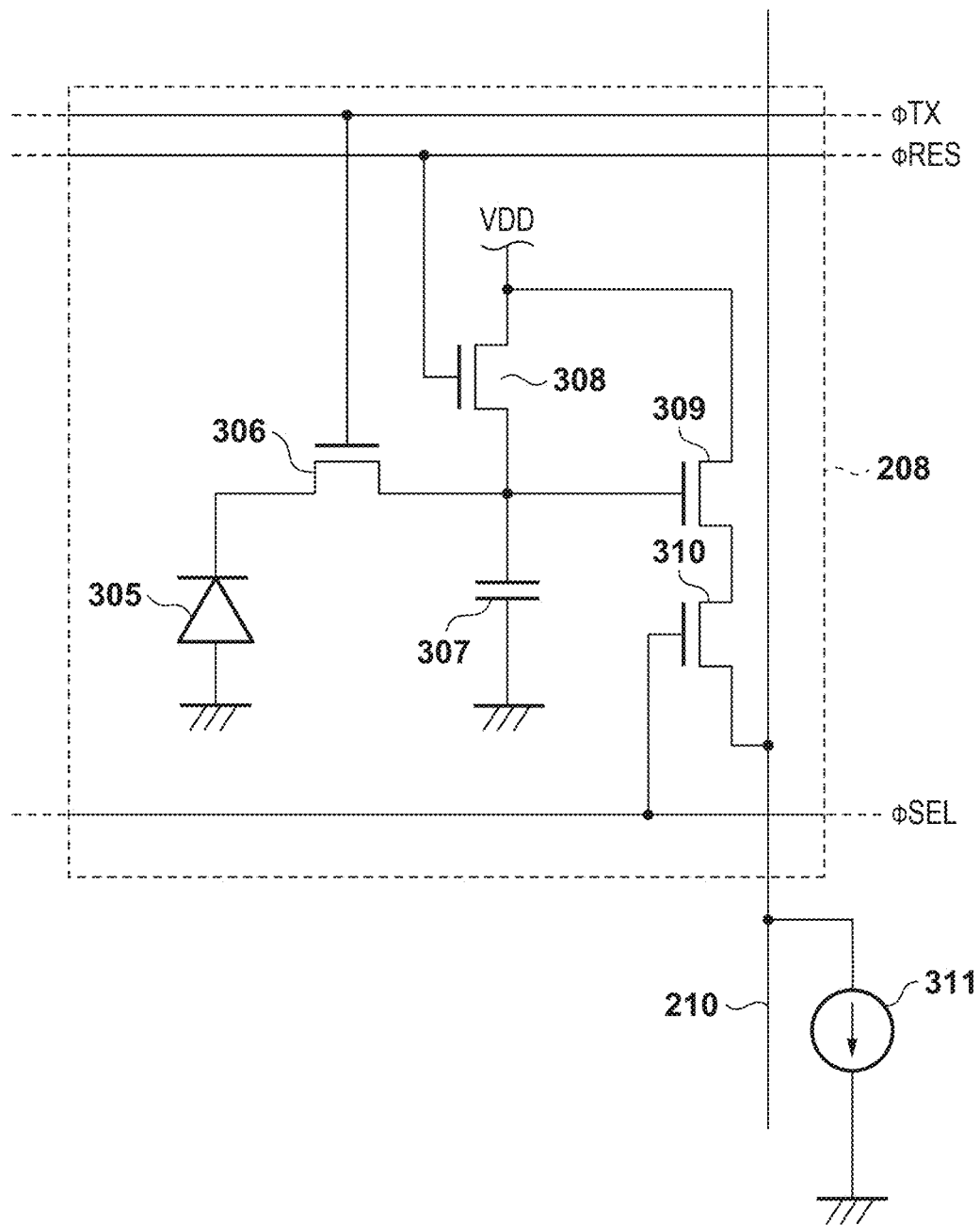
FIG. 3 illustrates an equivalent circuit diagram of a pixel according to the embodiment.

FIG. 3 shows an equivalent circuit diagram of the pixel 205.

A photodiode (PD) 305 accumulates charges generated by photoelectric conversion corresponding to the amount of incident light. The charges accumulated in the PD 305 are transferred to a floating diffusion (FD) 307 by the vertical scanning circuit 204 controlling a transfer control signal φTX to turn on a transfer switch 306.

An output transistor 309 constitutes a source follower circuit together with a constant current source 311 connected to the vertical output line 210, amplifies the voltage signal corresponding to the charge accumulated in the FD 307, and outputs it as a pixel signal. Here, by controlling the a selection control signal φSEL by the vertical scanning circuit 204, the output transistor 309 of the row whose row selection switch 310 is turned ON is connected to the vertical output line 210, and the pixel signal is output to the vertical output line 210.

Further, the vertical scanning circuit 204 controls a reset control signal φRES to turn on a reset switch 308, thereby resetting the FD 307 to a predetermined voltage VDD. Further, the vertical scanning circuit 204 controls the reset control signal φRES and the transfer control signal φTX to simultaneously turn on the reset switch 308 and the transfer switch 306, thereby resetting the PD 305 to the predetermined voltage VDD.

The transfer control signal φTX, the reset control signal φRES, and the row selection control signal φSEL are output by the control circuit 112 controlling the vertical scanning circuit 204.

Figure 4A:
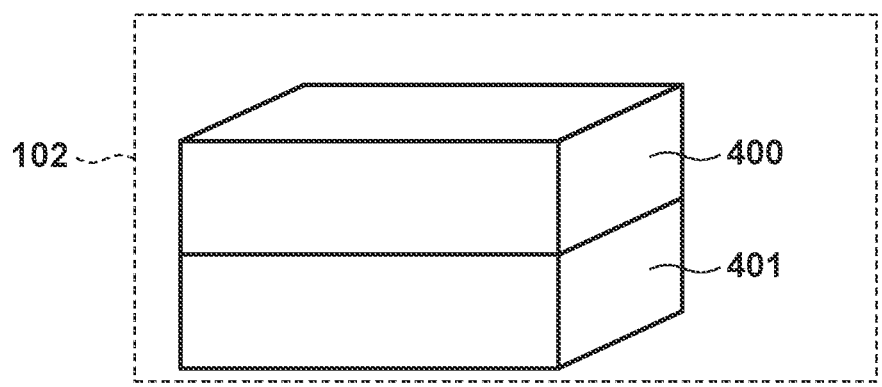
FIGS. 4A to 4C illustrate schematic diagrams showing a layered structure of the image sensor according to the embodiment.
Figure 4B:
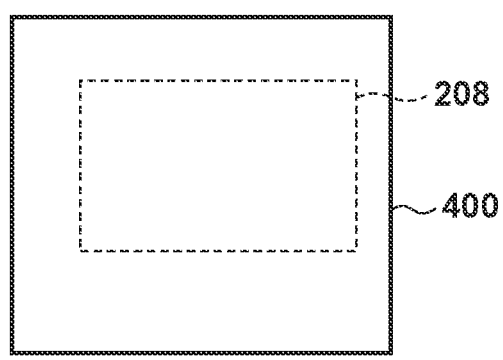
Figure 4C:
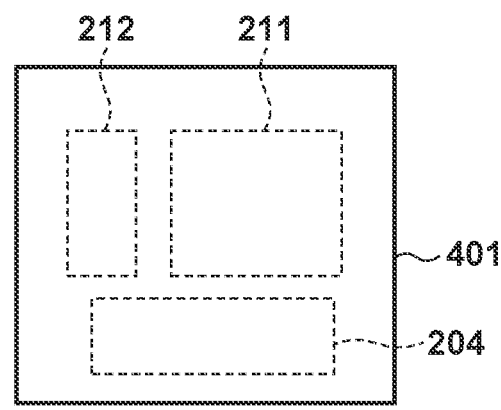

FIGS. 4A to 4C are schematic diagrams showing a layered structure of the image sensor 102, FIG. 4A being an oblique view, and FIGS. 4B and 4C being top views of respective semiconductor substrates.

The image sensor 102 is formed by stacking a first semiconductor substrate 400 and a second semiconductor substrate 401 at the chip level. A region including the pixel section 208 is formed on the first semiconductor substrate 400, and high-speed logic circuits such as the vertical scanning circuit 204, the column circuit unit 211, and the output unit 212 are formed on the second semiconductor substrate 401.

Figure 5:
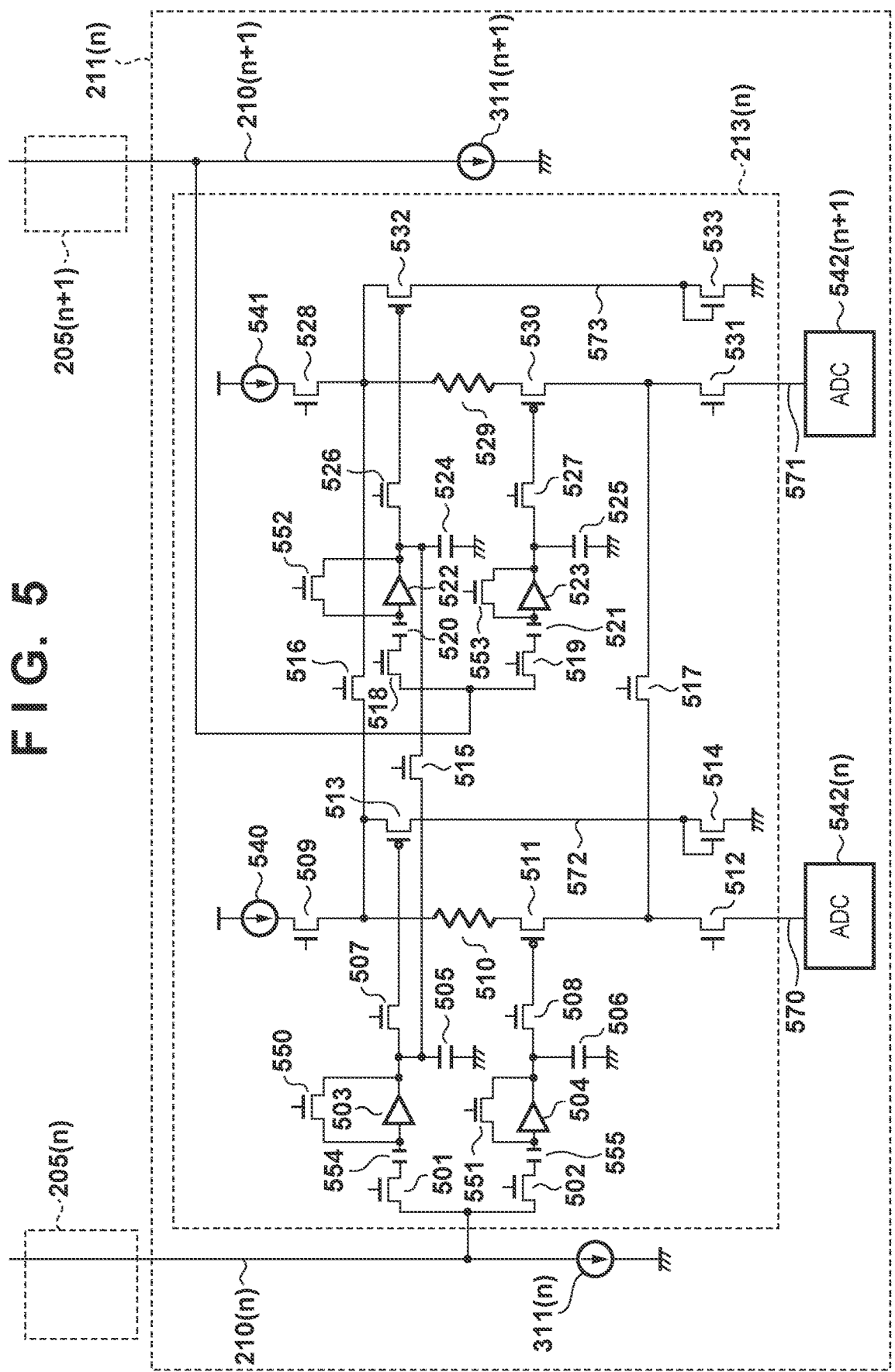
FIG. 5 illustrates a circuit diagram showing a configuration of part of a column circuit unit according to a first embodiment.

FIG. 5 is an equivalent circuit diagram showing the configuration of the column circuit unit 211 for two columns in the first embodiment, and the column circuit unit 211(n) is provided for every two columns of the pixel section 208. Here, the configuration corresponding to the nth column of the pixel section 208 has (n) after the reference number indicating each configuration, and the configuration corresponding to the (n+1)th column of the pixel section 208 has (n+1) after the reference number (n is a natural number).

The column circuit unit 211(n) has a circuit 213(n) that performs sample-and-hold and outputs current, and ADCs 542(n) and 542(n+1) that perform A/D conversion. The vertical output line 210(n) and the vertical output line 210(n+1) are connected to the circuit 213(n) of the column circuit unit 211(n).

In the above configuration, a pixel signal of the pixel 205(*n*) in the row selected by the vertical scanning circuit 204 is output to the vertical output line 210(*n*), and a pixel signal of the pixel 205(*n*+1) is output to the vertical output line 210(*n*+1).

[Detailed Configuration and Operation of Column Circuit Unit 211(*n*)]

Independent Readout Mode

First, an independent readout mode will be explained. In the independent readout mode, pixel signals of the pixel 205(*n*) and the pixel 205(*n*+1) are read out separately.

First, in the column circuit unit 211(*n*), the configuration and operation of the circuit portion that samples and holds the reset signal of the pixel 205(*n*) (the pixel signal output from the pixel 205(*n*) after resetting) will be described.

The input terminal of a switch 501 is connected to the vertical output line 210(*n*) and controlled to be ON when reading out the reset signal from the pixel 205(*n*). The output terminal of the switch 501 is connected to the input terminal of a capacitor 554. The output terminal of the capacitor 554 is connected to the input terminal of a switch 550 and the non-inverting input terminal of a non-inverting amplifier 503.

The output terminal of the switch 550 and the output terminal of the non-inverting amplifier 503 are connected to one terminal of a capacitor 505 and the input terminal of a switch 507. The other terminal of the capacitor 505 is grounded. The output terminal of the switch 507 is connected to the gate of a P-type source follower 513 and the source of the source follower 513 is connected to the input terminal of a resistor 510, and when the switch 507 is turned on, the potential of the gate of the source follower 513 becomes a potential corresponding to the reset signal.

Next, in the column circuit unit 211(*n*), the configuration and operation of the circuit portion that samples and holds the optical signal of the pixel 205(*n*) (a pixel signal corresponding to the photocharge accumulated in the PD 305 of the pixel 205(*n*)) will be described.

The input terminal of a switch 502 is connected to the vertical output line 210(*n*) and controlled to be ON when reading out the optical signal from the pixel 205(*n*). The output terminal of the switch 502 is connected to the input terminal of a capacitor 555. The output terminal of the capacitor 555 is connected to the input terminal of a switch 551 and the non-inverting input terminal of a non-inverting amplifier 504.

The output terminal of the switch 551 and the output terminal of the non-inverting amplifier 504 are connected to one terminal of a capacitor 506 and the input terminal of a switch 508. The other terminal of the capacitor 506 is grounded. The output terminal of the switch 508 is connected to the gate of a P-type source follower 511 and the source of the source follower 511 is connected to the output terminal of the resistor 510, and when the switch 508 is turned on, the potential of the gate of the source follower 511 becomes a potential corresponding to the optical signal.

That is, the input terminal of the resistor 510 (current source 540 side) has a potential corresponding to the reset signal of the pixels 205(*n*), and the output terminal of the resistor 510 (the side opposite to the current source 540) has a potential corresponding to the optical signal of the pixel 205(*n*).

The input terminal of the current source 540 is connected to the high potential power supply, and the output terminal is connected to the input terminal of a switch 509. The output terminal of the switch 509 is connected to the input terminal of the resistor 510, one terminal of a switch 516, and the source of the source follower 513. The output terminal of the resistor 510 is connected to the source of the source follower 511. The drain of source follower 511 is connected to the input terminal of a switch 512 and one terminal of a switch 517. The output terminal of the switch 512 is connected to an ADC 542(*n*).

In this configuration, by turning on the switches 509 and 512 and turning off the switches 516 and 517, a current corresponding to the potential difference between the optical signal and the reset signal of the pixel 205(*n*) and to the impedance of the resistor 510 flows through a current signal transfer line 570 via the switch 512 and is input to the ADC 542(*n*).

The ADC 542(*n*) A/D-converts the input current signal into a digital signal. Note that the ADC 542(*n*) may be of any type, such as a successive approximation type, a ramp type, or a ΔΣ modulation type. Also, the amount of current obtained by subtracting the current flowing through the resistor 510 from the current of the current source 540 flows to the ground through the source follower 513 and a MOS diode 514 in a residual current line 572.

Next, in the column circuit unit 211(*n*), the configuration and operation of the circuit portion that samples and holds the reset signal of the pixel 205(*n*+1) (the pixel signal output from the pixel 205(*n*+1) after resetting) will be described.

The input terminal of a switch 518 is connected to the vertical output line 210(*n*+1) and controlled to be ON when reading out the reset signal from the pixel 205(*n*+1). The output terminal of the switch 518 is connected to the input terminal of a capacitor 520. The output terminal of the capacitor 520 is connected to the input terminal of a switch 552 and the non-inverting input terminal of a non-inverting amplifier 522.

The output terminal of the switch 552 and the output terminal of the non-inverting amplifier 522 are connected to one terminal of a capacitor 524 and the input terminal of a switch 526. The other terminal of the capacitor 524 is grounded. The output terminal of the switch 526 is connected to the gate of a P-type source follower 532, the source of the source follower 532 is connected to the input terminal of a resistor 529, and when the switch 526 is turned on, the potential of the gate of the source follower 532 becomes a potential corresponding to the reset signal.

Next, in the column circuit unit 211(*n*), the configuration and operation of the circuit portion that samples and holds the optical signal of the pixel 205(*n*+1) (a pixel signal corresponding to the photocharge accumulated in the PD 305 of the pixel 205(*n*+1)) will be described.

The input terminal of a switch 519 is connected to the vertical output line 210(*n*+1) and controlled to be ON when reading the optical signal from the pixel 205(*n*+1). The output terminal of the switch 519 is connected to the input terminal of a capacitor 521. The output terminal of the capacitor 521 is connected to the input terminal of a switch 553 and the non-inverting input terminal of a non-inverting amplifier 523.

The output terminal of the switch 553 and the output terminal of the non-inverting amplifier 523 are connected to one terminal of a capacitor 525 and the input terminal of a switch 527. The other terminal of the capacitor 525 is grounded. The output terminal of the switch 527 is connected to the gate of a P-type source follower 530 and the source of the source follower 530 is connected to the output terminal of the resistor 529, and when the switch 527 is turned on, the potential of the gate of the source follower 530 becomes a potential corresponding to the optical signal.

That is, the input terminal of the resistor 529 (current source 541 side) has a potential corresponding to the reset signal of the pixel 205(n+1), and the output terminal of the resistor 529 (the side opposite to the current source 541) has a potential corresponding to the optical signal of the pixel 205(n+1).

The input terminal of the current source 541 is connected to the high potential power supply, and the output terminal is connected to the input terminal of a switch 528. The output terminal of the switch 528 is connected to the input terminal of the resistor 529, one terminal of a switch 516, and the source of the source follower 532. The output terminal of the resistor 529 is connected to the source of the source follower 530. The drain of source follower 530 is connected to the input terminal of a switch 531 and one terminal of a switch 517. The output terminal of the switch 531 is connected to an ADC 542(n+1).

In this configuration, by turning on the switches 528 and 531 and turning off the switches 516 and 517, a current corresponding to the potential difference between the optical signal and the reset signal of the pixel 205(n+1) and to the impedance of the resistor 529 flows through a current signal transfer line 571 via the switch 531 and is input to the ADC 542(n+1).

The ADC 542(n+1) A/D-converts the input current signal into a digital signal. Also, the amount of current obtained by subtracting the current flowing through the resistor 529 from the current of the current source 541 flows to the ground through the source follower 532 and a MOS diode 533 in a residual current line 573.

By turning off the switches 516 and 517 (when not connected) as in the above operation, the signals of the pixel 205(n) and the pixel 205(n+1) can be read out independently.

Addition Readout Mode

Next, an addition readout mode will be explained. In the addition readout mode, pixel signals of the pixel 205(n) and the pixel 205(n+1) are added and read out.

The column circuit unit 211(n) has the switch 516 and the switch 517 as parts for connecting circuits for sampling and holding reset signals and optical signals of the pixel 205(n) and the pixel 205(n+1), respectively.

A switch 515 connects the node between the capacitor 505 and the non-inverting amplifier 503 and the node between capacitor 524 and the non-inverting amplifier 522 to average the sampling signals of the reset signals. Thereby, reset noise can be reduced by making the levels of the reset signals the same potential.

The switch 516 is a switch that connects the source of the source follower 513 and the source of the source follower 532, and the switch 517 is a switch that connects the source of the source follower 511 and the source of the source follower 530. By turning ON the switches 516 and 517, current addition of the pixel 205(n) and the pixel 205(n+1) becomes possible.

As in the independent readout mode described above, the switches 516 and 517 are turned on while the reset signals and optical signals of the pixels 205(n) and 205(n+1) are sampled and held. As a result, the input terminal of the resistor 510 (current source 540 side) has a potential corresponding to the added signal of the reset signal of the pixel 205(n) and the reset signal of the pixel 205(n+1), and the output terminal of the resistor 510 (the side opposite to the current source 540) has a potential corresponding to the added signal of the optical signal of the pixel 205(n) and the optical signal of the pixel 205(n+1).

In this state, by turning on the switches 509, 512 and 528 and turning off the switch 531, a current corresponding to the potential difference between the added signal of the optical signals of the pixels 205(n) and 205(n+1) and the added signal of the reset signals of the pixels 205(n) and 205(n+1) and to the impedance of resistor 510 flows through the current signal transfer line 570 via the switch 512 and is input to the ADC 542(n). The ADC 542(n) A/D-converts the input current signal into a digital signal. Also, the amount of current obtained by subtracting the current flowing through the resistor 510 from the current of the current source 540 flows to the ground through the source follower 513 and the MOS diode 514 in the residual current line 572.

By turning on the switches 516 and 517 (when connected) as in the above operation, the signals of the pixel 205(n) and the pixel 205(n+1) can be added and read out.

Timing Control During Addition

Figure 6:
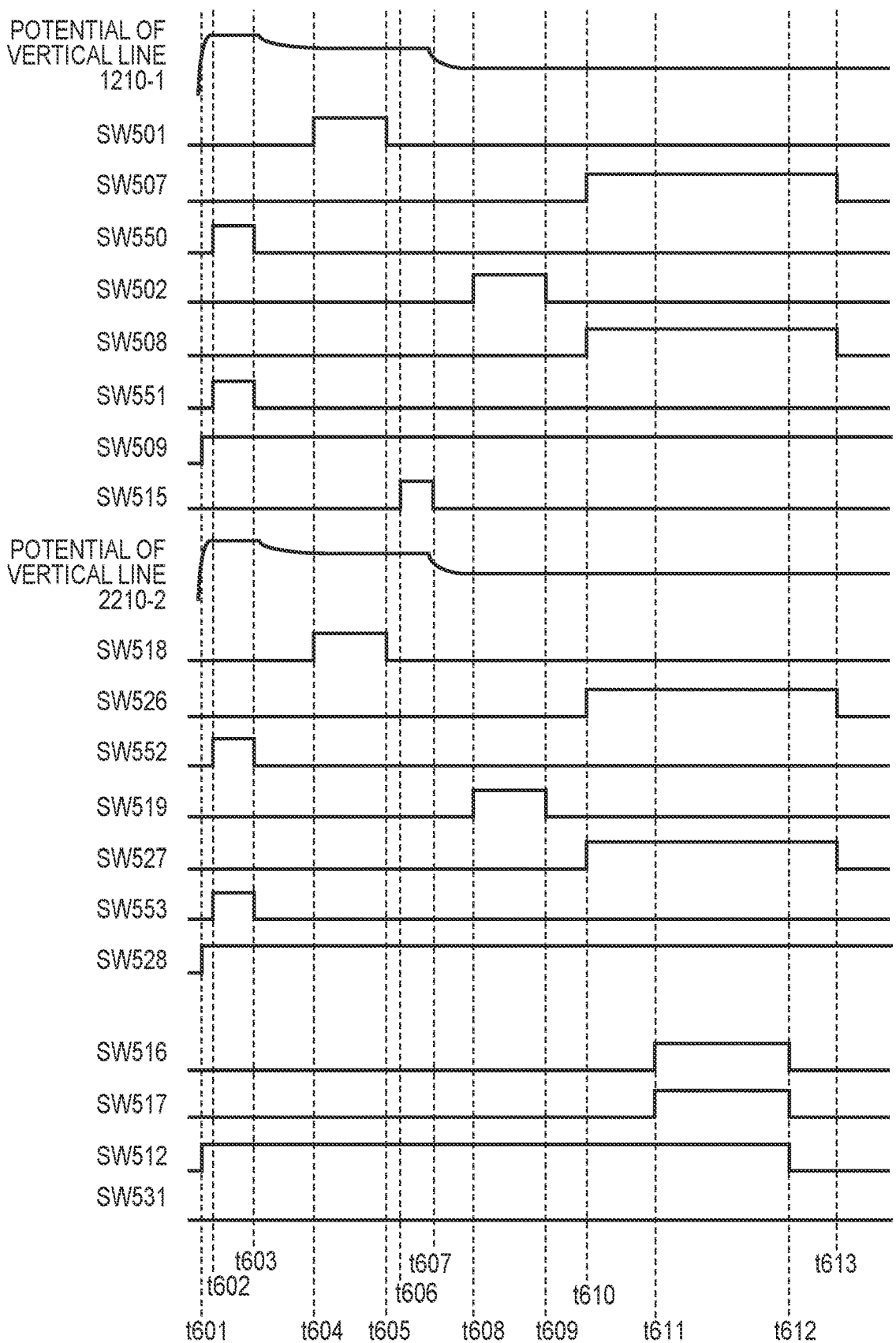
FIG. 6 illustrates a timing chart showing control at the time of addition reading according to the first embodiment.

FIG. 6 is a timing chart showing the control timing of the circuit 213(n) shown in FIG. 5 in the first embodiment, and showing the operation timing of the switches when adding and reading out the signals of pixel 205(n) and pixel 205(n+1). Note that ON/OFF control of each switch shown in FIG. 6 is performed by the control circuit 112.

First, at time t601, the switches 509, 528, and 512 are turned on to prepare to allow current to flow through the current signal transfer line 570.

At time t602, the switches 550, 551, 552, and 553 are turned on to reset the non-inverting amplifiers 503, 504, 522, and 523, and at time t603, the switches 550, 551, 552, and 553 are turned off.

Between time t603 and time t604, the vertical scanning circuit 204 resets the pixels 205 in the selected row. Then, when the row selection control signal ϕSEL is set to HIGH and the row selection switch 310 is turned ON, the reset signals of the FDs 307 of the pixels 205(n) and 205(n+1) are output to the vertical output lines 210(n) and 210(n+1), respectively.

At time t604, the switches 501 and 518 are turned on to hold the reset signals of the pixel 205(n) and pixel 205(n+1) in capacitors 554 and 520, respectively. At time t605, the switches 501 and 518 are turned off.

At time t606, the switch 515 is turned on to average the reset signals, and at time t607, the switch 515 is turned off.

Between time t606 and time t608, the vertical scanning circuit 204 turns the transfer control signal ϕTX of the selected row to HIGH to turn on the transfer switches 306, thereby transferring the charges accumulated in the PDs 305 of the pixels 205(n) and pixels 205(n+1) to the FDs 307. At this time, since the row selection switches 310 are already turned on, the voltage signals corresponding to the charges transferred to the FDs 307 of the pixels 205(n) and 205(n+1) of the selected row are output to the vertical output lines 210(n) and 210(n+1) as optical signals, respectively.

At time t608, the switches 502 and 519 are turned on to hold the optical signals of the pixels 205(n) and 205(n+1) in the capacitors 555 and 521, respectively. At time t609, the switches 502 and 519 are turned off.

At time t610, the switches 507, 508, 526, and 527 are turned on, and the terminals of the resistors 510 and 529 are set to potentials corresponding to the reset signals and pixel signals of the pixels 205(n) and pixels 205(n+1), respectively, through the source followers 513, 511, 532 and 530.

At time t611, the switches 516 and 517 are further turned on to output a signal obtained by adding the current signals of the pixels 205(n) and 205(n+1) to the ADC 542(n). The ADC 542(n) A/D-converts the input current signal into a digital signal.

At time t612, the switches 516, 517, and 512 are turned off, and at time t613, the switch 507, 508, 526, and 527 are turned off, and the control ends.

As described above, according to the first embodiment, the signals output from the pixels of a plurality of columns can be converted into current signals and added with the above circuit configuration. As virtues of this, it is possible to suppress the influence of noise and to add signals of a plurality of pixels.

In the above example, the configuration in which signals of the pixels 205 are added by two columns at a time has been described, but the present invention is not limited to this. By duplicating the configuration for the (n+1)th column and connecting them with switches similar to the switches 516 and 517, the signals output from any number of columns of pixels 205 can be converted into current signals and added.

Second Embodiment

Next, a second embodiment of the present invention will be described with reference to FIGS. 7 and 8. The second embodiment shows an example of suppressing the total amount of current by decreasing the current value of the current source and increasing the resistance value. Note that the configurations of the image capturing apparatus 100 and the image sensor 102 are the same as those described with reference to FIGS. 1 to 4C in the first embodiment, except for the configuration of the column circuit unit 211, therefore, the description thereof is omitted.

Figure 7:
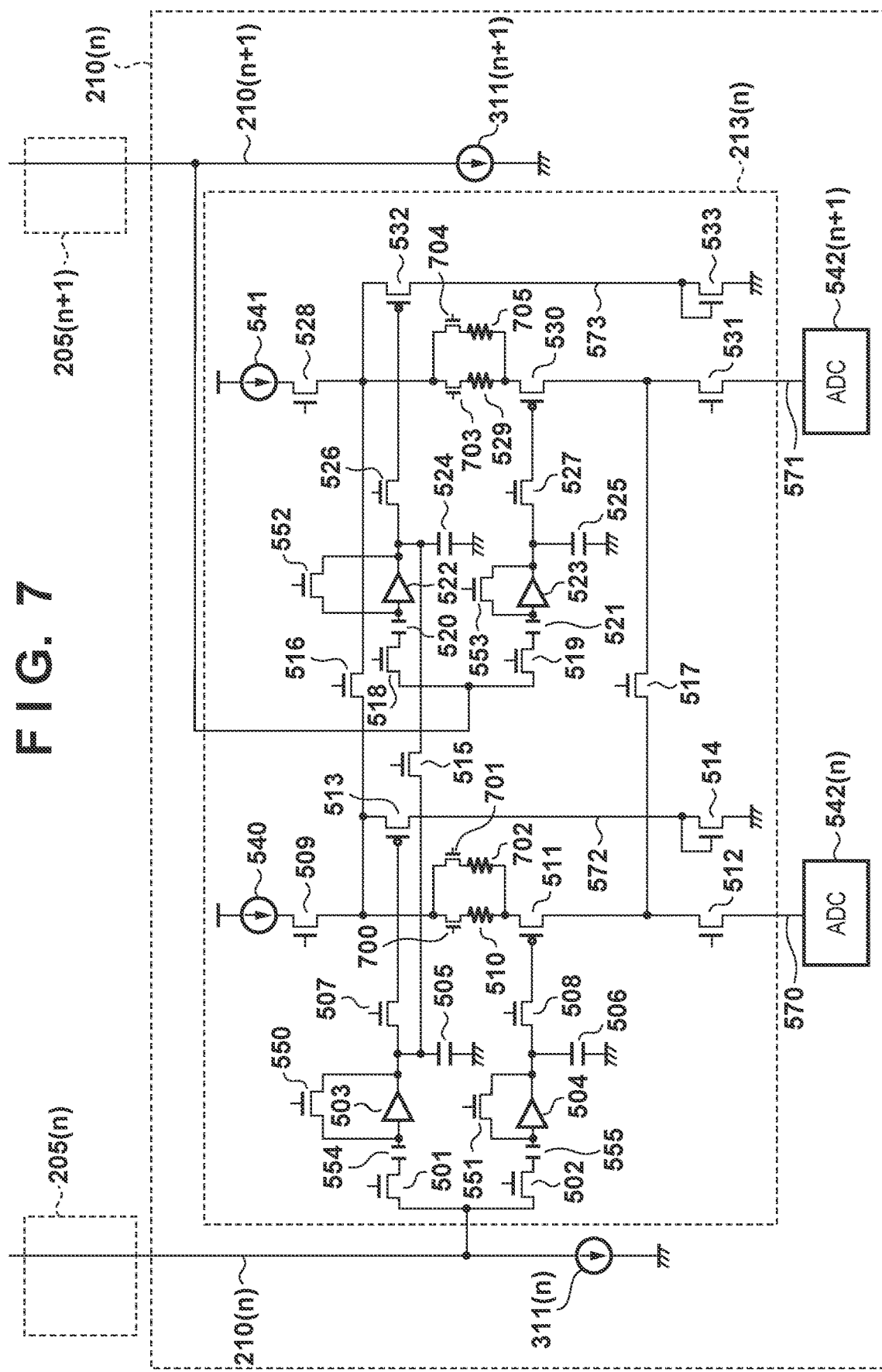
FIG. 7 illustrates a circuit diagram showing a configuration of part of a column circuit unit according to a second embodiment.

FIG. 7 is an equivalent circuit diagram showing the configuration of the column circuit unit 211 for two columns in the second embodiment. The configuration shown in FIG. 7 is a configuration in which resistors 702 and 705 and switches 700, 701, 703 and 704 are added to the configuration shown in FIG. 5.

More specifically, the resistor 702 is connected in parallel with the resistor 510, the switch 700 is connected between the resistor 510 and the switch 509, and the switch 701 is connected between the resistor 702 and the switch 509.

Further, the resistor 705 is connected in parallel with the resistor 529, the switch 703 is connected between the resistor 529 and the switch 528, and the switch 704 is connected between the resistor 705 and the switch 528. Since the configuration other than these is the same as that described with reference to FIG. 5, description thereof will be omitted.

Here, the resistors 702 and 705 have resistance values greater than those of the resistors 510 and 529, and the number of current sources used is reduced from two to one. With this configuration, it is possible to obtain the same signal level as in a case of using a small resistance value while suppressing the current. For example, if the resistors 510 and 529 are 100Ω, the resistors 702 and 705 with 200Ω can be used.

In the example shown in FIG. 7, a plurality of resistors are connected in parallel and one of them is selected. However, the present invention is not limited to this, and a configuration capable of changing the resistance value may be used. For example, by connecting a plurality of resistors in series and connecting to any node including both ends between the connected resistors, the resistance value can be changed. Alternatively, a variable resistor may be used.

Timing Control During Addition

Figure 8:
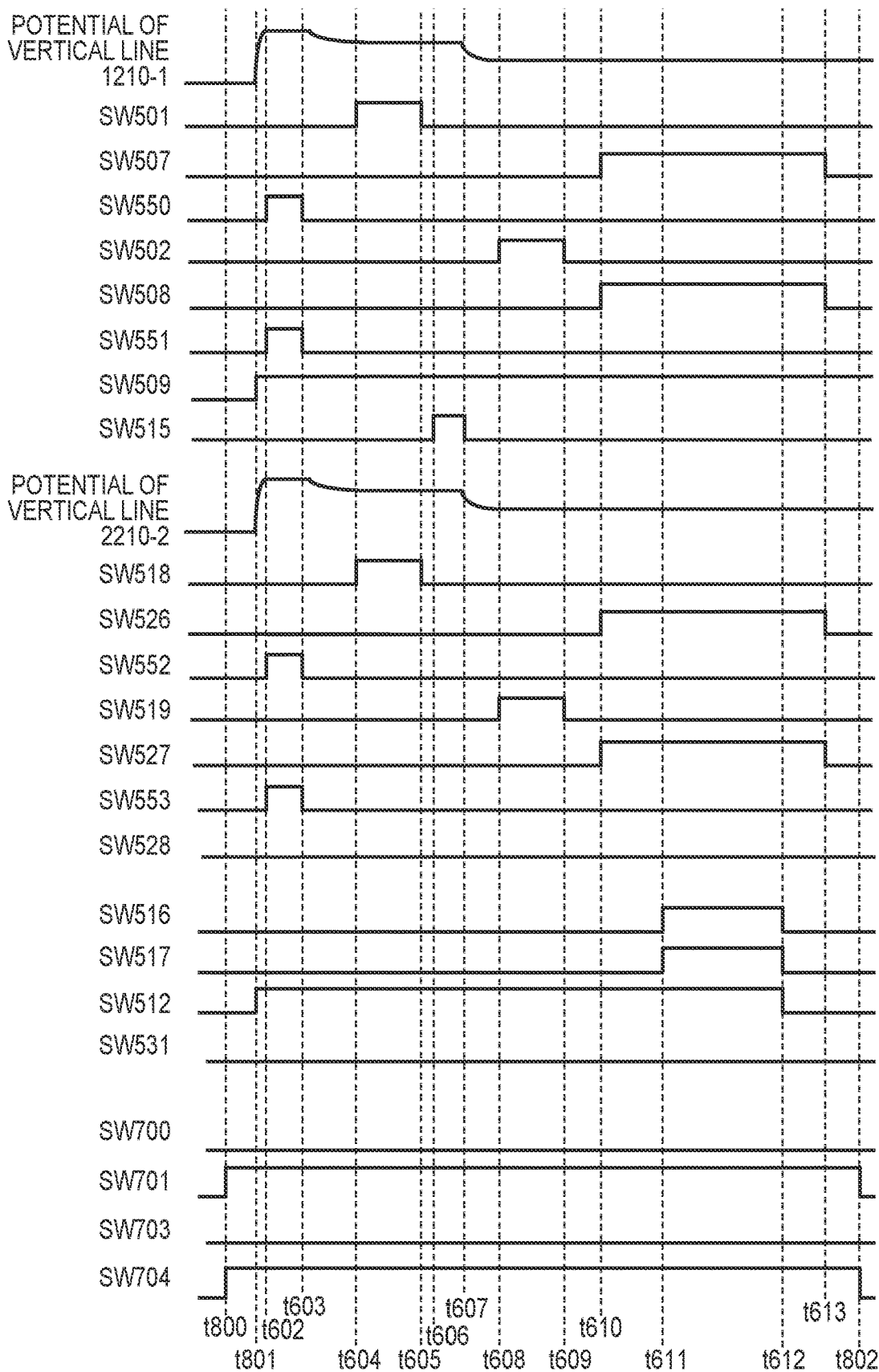
FIG. 8 illustrates a timing chart showing control at the time of addition reading according to the second embodiment.

FIG. 8 is a timing chart showing the control timing of the circuit 213(n) shown in FIG. 7 in the second embodiment, and showing the operation timing of the switches when adding and reading out the signals of a pixel 205(n) and a pixel 205(n+1). Note that ON/OFF control of each switch shown in FIG. 8 is performed by the control circuit 112. The differences from the control shown in FIG. 6 described in the first embodiment are that the control at time t801 is different from the control at time t601, the control at time t800 before time t801 is added, and the control at time t802 is added after the control at time t613.

First, at time t800, the switches 701 and 704 are turned on to use the resistors 702 and 705.

Then at time t801, the switches 509 and 512 are turned on to prepare to allow current to flow through the current signal transfer line 570. The switch 528 is turned on in the first embodiment, it remains off in the second embodiment.

The control from time t602 to time t802 is the same as the control shown in FIG. 6 of the first embodiment.

At time t802, the switches 701 and 704 are turned off.

It is also possible to change the addition ratio of the two signals by making the weight of the signals different. For example, by setting the resistor 702 to 200Ω and the resistor 705 to 400Ω, it is possible to add the signals from the pixel 205(n) and the pixel 205(n+1) at a ratio of 2:1 with the same operation.

As described above, according to the second embodiment, power consumption can be suppressed as compared with the circuit configuration shown in FIG. 5 and the control shown in FIG. 6. Also, it is possible to change the addition ratio by changing the resistance values. As a result, it is possible to correct the position of the center of gravity of the added signal in a case of reducing the number of pixels to be read out, and thus, it is possible to output a high-quality image.

Third Embodiment

Next, a third embodiment of the present invention will be described with reference to FIGS. 9 and 10. The third embodiment shows an example of current addition of signals output from a plurality of pixels 205 arranged in the vertical direction. Note that the configurations of the image capturing apparatus 100 and the image sensor 102 are the same as those described with reference to FIGS. 1 to 4C in the first embodiment, except for the configuration of the column circuit unit 211, therefore, the description thereof is omitted.

Figure 9:
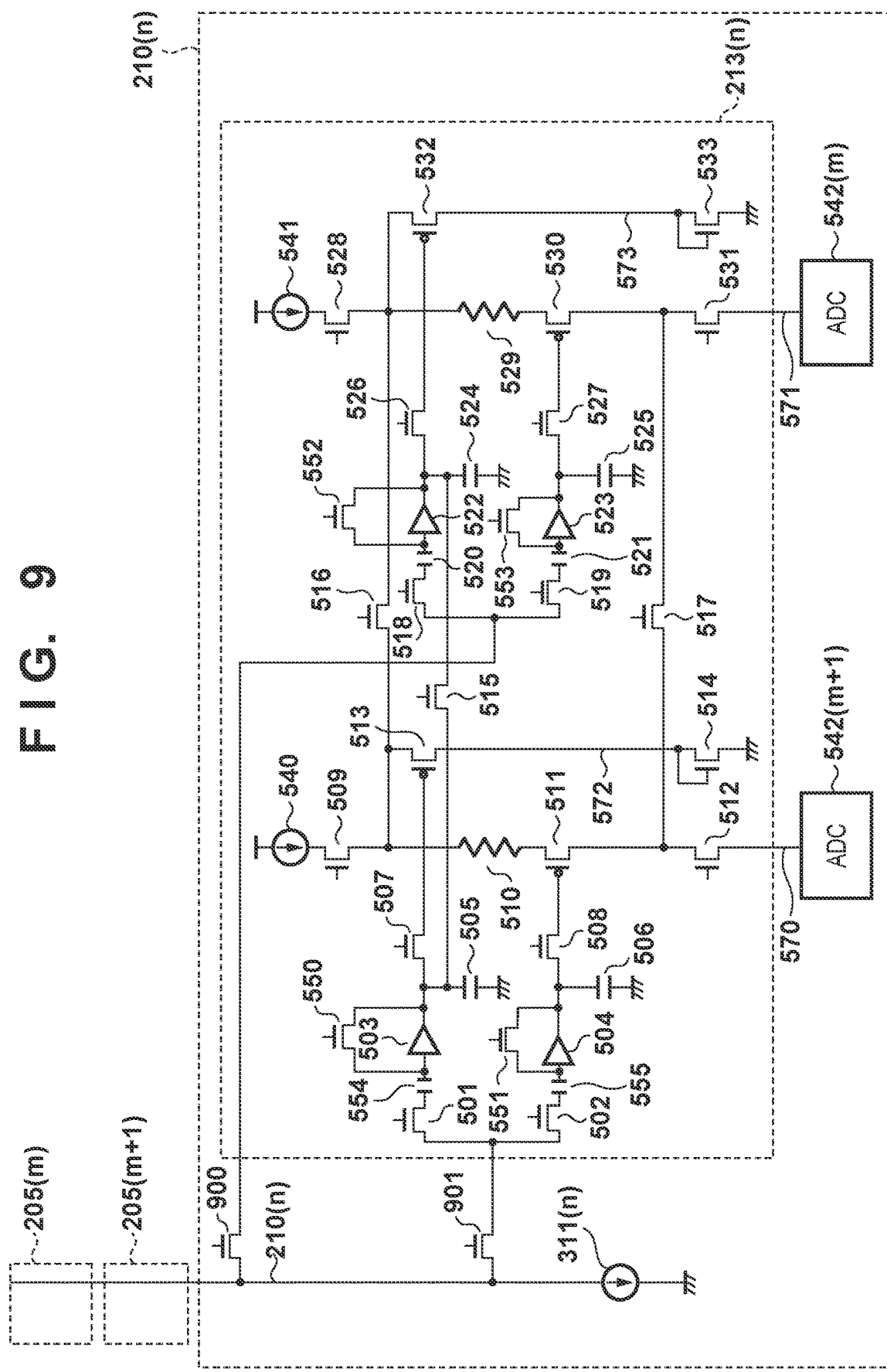
FIG. 9 illustrates a circuit diagram showing a configuration of part of a column circuit unit according to a third embodiment.

FIG. 9 is an equivalent circuit diagram showing the configuration of the column circuit unit 211 for one column in the third embodiment. The column circuit unit 211(n) shown in FIG. 5 has a configuration in which the signals of the pixels in the nth and (n+1)th columns are input in parallel, whereas the column circuit unit 211(n) (n is a natural number) shown in FIG. 9 has a configuration in which the signals of the pixels 205 in the mth row and (m+1)th row of the same column (n) are input sequentially (m is a natural number). Further, the configuration in FIG. 9 is different from FIG. 5 in that switches 900 and 901 are added between the vertical output line 210(n) and the circuit 213. Since the configuration other than these is the same as that described with reference to FIG. 5, description thereof will be omitted.

Timing Control During Addition

Figure 10:
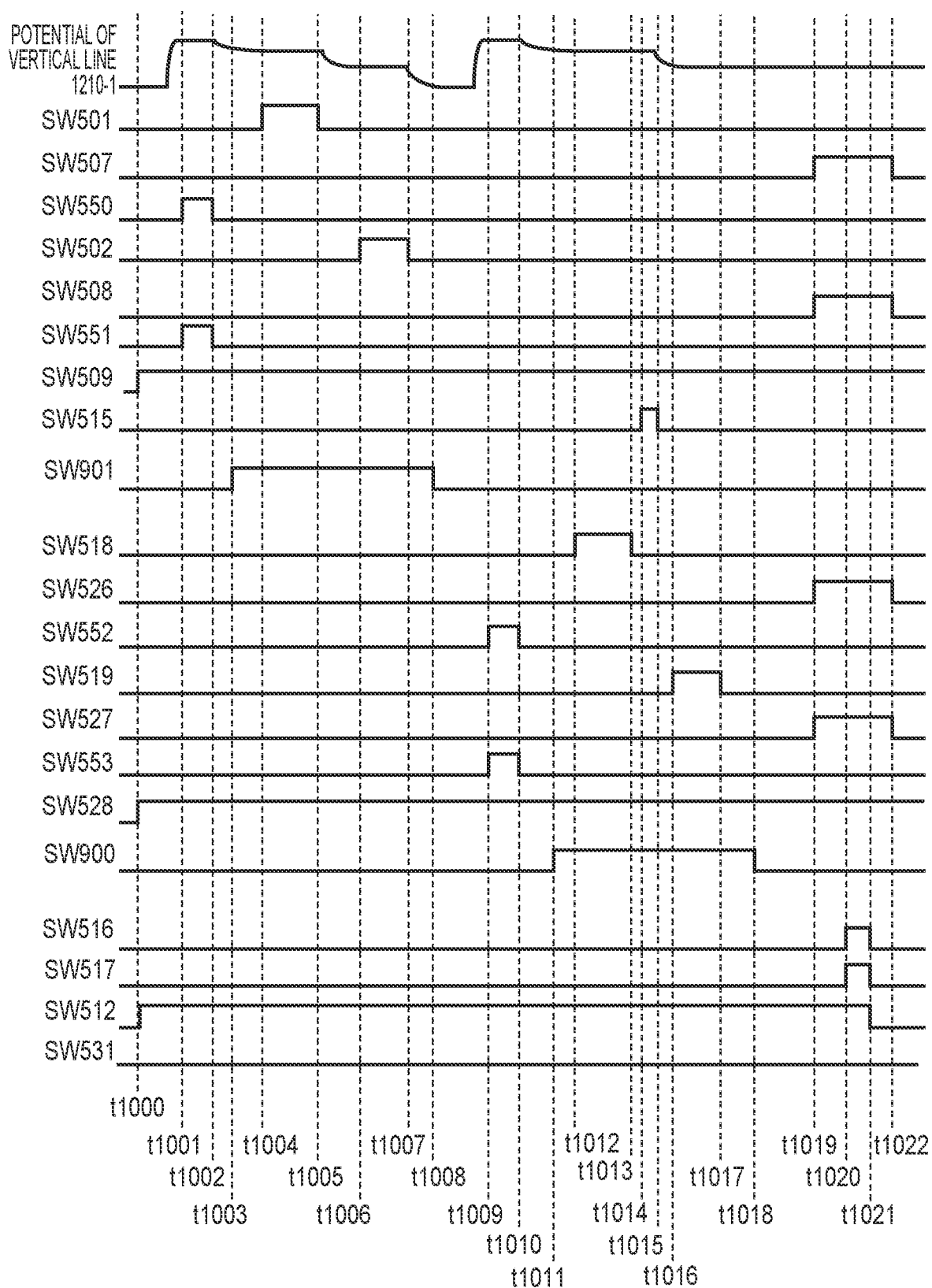
FIG. 10 illustrates a timing chart showing control at the time of addition reading according to the third embodiment.

FIG. 10 is a timing chart showing the control timing of the circuit 213(n) shown in FIG. 9 in the third embodiment, and showing the operation timing of the switches when adding and reading out the signals of pixel 205(m) in the mth row and pixel 205(m+1) in the (m+1)th row in the nth column. Note that ON/OFF control of each switch shown in FIG. 10 is performed by the control circuit 112.

First, at time t1000, the switches 509, 528 and 512 are turned on to prepare to allow current to flow through the current signal transfer line 570.

Next at time t1001, the switches 550 and 551 are turned on to reset the non-inverting amplifiers 503 and 504, and at time t1002, the switches 550 and 551 are turned off.

At time t1003, the switch 901 is turned on. By this time t1003, the vertical scanning circuit 204 performs control so that a reset signal of the FD 307 is output to the vertical output line 210($n$) by resetting the pixel 205($m$) in the selected row and turning on the row selection switch 310 of the pixel 205($m$). Also, while the switch 901 is ON (between time t1003 and time t1008), by turning on the row selection switch 310 that connects the pixel 205($m$) and the vertical output line 210($n$), the signal of the pixel 205($m$) is transferred.

At time t1004, the switch 501 is turned on to hold the reset signal of the pixel 205($m$) in the capacitor 554, and at time t1005, the switch 501 is turned off.

Between time t1005 and time t1006, the vertical scanning circuit 204 turns the transfer control signal ɸTX of the selected row (the mth row) to HIGH to turn on the transfer switch 306, thereby transferring the charges accumulated in the PD 305 of the pixel 205($m$) to the FD 307. Since the row selection switch 310 of the pixel 205($m$) is ON, an optical signal is output from the FD 307 of the pixel 205($m$) to the vertical output line 210($n$).

At time t1006, the switch 502 is turned on to hold the optical signal of the pixel 205($m$) in the capacitor 555, and at time t1007, the switch 502 is turned off. Further, the switch 901 is turned off at time t1008. This completes holding of the reset signal and optical signal of the pixel 205($m$).

Next, at time t1009, the switches 518 and 519 are turned on to reset the non-inverting amplifiers 522 and 523, and at time t1010, the switches 518 and 519 are turned off.

At time t1011, the switch 900 is turned on. By this time t1011, the vertical scanning circuit 204 performs control so that a reset signal of the FD 307 is output to the vertical output line 210($n$) by resetting the pixel 205($m$+1) in the selected row and turning on the row selection switch 310 of the pixel 205($m$+1). Also, while the switch 900 is ON (between time t1011 and time t1018), by turning on the row selection switch 310 that connects the pixel 205($m$+1) and the vertical output line 210($n$), the signal of the pixel 205($m$+1) is transferred.

At time t1012, the switch 518 is turned on and the reset signal of pixel 205($m$+1) is held in the capacitor 520, and at time t1013, the switch 518 is turned off.

At time t1014, the switch 515 is turned on to average the reset signals of the pixel 205($m$) and the pixel 205($m$+1), and at time t1015, the switch 515 is turned off.

Between time t1015 and time t1016, the vertical scanning circuit 204 turns the transfer control signal ɸTX of the selected row (the ($m$+1)th row) to HIGH to turn on the transfer switch 306, thereby transferring the charge accumulated in the PD 305 of the pixel 205($m$+1) to the FD 307. Since the row selection switch 310 of the pixel 205($m$) is ON, an optical signal is output from the FD 307 of the pixel 205($m$+1) to the vertical output line 210($n$).

At time t1016, the switch 519 is turned on to hold the optical signal of the pixel 205($m$+1) in the capacitor 521, and at time t1017, the switch 519 is turned off. Further, the switch 900 is turned off at time t1018. This completes holding of the reset signal and optical signal of the pixel 205($m$+1).

Next, at time t1019, the switches 507, 508, 526, and 527 are turned on, and the terminals of the resistors 510 and 529 are set to potentials corresponding to the reset signals and pixel signals of the pixels 205($m$) and pixels 205($m$+1), respectively, through the source followers 513, 511, 532 and 530.

At time t1020, the switches 516 and 517 are further turned on to output a signal obtained by adding the current signals of the pixels 205($m$) and 205($m$+1) to the ADC 542($m$). The ADC 542($m$) A/D-converts the input current signal into a digital signal.

At time t1021, the switches 516, 517, and 512 are turned off, and at time t1022, the switch 507, 508, 526, and 527 are turned off, and the control ends.

In the control shown in FIG. 10, the case of adding and reading out the signals of the pixels by two rows in the same column connected to the vertical output line 210 has been described, but the same configuration may be used to read out the signals independently. In that case, the signals of pixel 205($m$) and the pixel 205($m$+1) should be output to the ADC 542($m$) and the ADC 542 ($m$+1), respectively, without turning on the switches 516 and 517 (unconnected state).

In the above example, the configuration in which the pixels 205 are added by two rows at a time has been described, but the present invention is not limited to this. By duplicating the configuration for the ($m$+1)th row and connecting them with switches similar to the switches 516 and 517, the signals output from any number of rows of pixels 205 can be converted into current signals and added.

In addition, in the third embodiment, an example of adding signals from the pixels 205($m$) and pixels 205($m$+1) is shown, however, it is also possible to implement a multi-sampling function that reduces noise by sampling the signal of the pixel 205($m$) in the capacitors 505, 506, 524, and 525, respectively, and adding them.

As described above, according to the third embodiment, the signals output from the pixels of a plurality of rows can be converted into current signals and added with the above circuit configuration. As virtues of this, it is possible to add signals of a plurality of pixels while suppressing the influence of noise.

In the above-described embodiments, an example in which the image sensor 102 of the present invention is mounted in the image capturing apparatus 100 has been described, however, the present invention is not limited to this, and may be mounted in various kinds of electronic devices. For example, the image sensor according to the present invention can be used in mobile communication terminals with camera functions such as mobile phones and smart phones, portable computers with camera functions, portable game machines with camera functions, and so forth.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-119835, filed Jul. 27, 2022 which is hereby incorporated by reference herein in its entirety.

What is claimed is:

1. An image sensor comprising:
   a plurality of sample-and-hold circuits that sample and hold a first signal and a second signal output from each of a plurality of different pixels;
   a plurality of converters each of which converts a potential difference between the first signal and the second signal held in the plurality of sample-and-hold circuits to a current, and includes a current source and a resistor connected in series;

a switch that connects/disconnects the plurality of converters; and a plurality of output circuits wherein, in a case where the switch connects the plurality of converters, the currents converted by the plurality of converters are added and output from one of the plurality of output circuits, and, in a case where the switch disconnects the plurality of converters, the currents converted by the plurality of converters are output from the plurality of output circuits, respectively, wherein, among the plurality of sample-and-hold circuits, the sample-and-hold circuit that holds the first signal is connected between the current source and the resistor, and the sample-and-hold circuit that holds the second signal is connected on a side opposite to the current source with respect to the resistor.

2. The image sensor according to claim 1, wherein each of the plurality of pixels includes a photoelectric converter that photoelectrically converts incident light and generates electric charge, and wherein the first signal is a signal output in a case where the each pixel is reset, and the second signal is a signal corresponding to the electric charge obtained by the photoelectric conversion by the photoelectric converter.

3. The image sensor according to claim 1, wherein the current source and the resistor are capable of changing their resistance values, and wherein the resistance value of the resistor is increased in a case where the switch connects the plurality of converters.

4. The image sensor according to claim 1, wherein the current source and the resistor are capable of changing their resistance values, and wherein the resistance values of the resistors are made different between the plurality of converters in a case where the switch connects the plurality of converters.

5. The image sensor according to claim 3, wherein the current source of one of the plurality of converters is used in a case where the switch connects the plurality of converters.

6. The image sensor according to claim 1 further comprising a pixel section in which a plurality of pixels are arranged in rows and columns, wherein the plurality of different pixels are pixels in different columns.

7. The image sensor according to claim 6, wherein the plurality of sample-and-hold circuits, the plurality of converters, the switch and the plurality of output circuits are provided for every predetermined number of columns.

8. The image sensor according to claim 1 further comprising a pixel section in which a plurality of pixels are arranged in rows and columns, wherein the plurality of different pixels are pixels in different rows in a same column.

9. The image sensor according to claim 8, wherein the plurality of sample-and-hold circuits, the plurality of converters, the switch and the plurality of output circuits are provided for each column.

10. The image sensor according to claim 1 further comprising an analog-to-digital converter that converts the currents output from the plurality of output circuits into digital signals.

11. An electronic apparatus comprising:
an image sensor comprising:
a plurality of sample-and-hold circuits that sample and hold a first signal and a second signal output from each of a plurality of different pixels;
a plurality of converters each of which converts a potential difference between the first signal and the second signal held in the plurality of sample-and-hold circuits to a current and includes a current source and a resistor connected in series;
a switch that connects/disconnects the plurality of converters; and
a plurality of output circuits wherein, in a case where the switch connects the plurality of converters, the currents converted by the plurality of converters are added and output from one of the plurality of output circuits, and, in a case where the switch disconnects the plurality of converters, the currents converted by the plurality of converters are output from the plurality of output circuits, respectively; and
a processor that processes the signal output from the image sensor,
wherein, among the plurality of sample-and-hold circuits, the sample-and-hold circuit that holds the first signal is connected between the current source and the resistor, and the sample-and-hold circuit that holds the second signal is connected on a side opposite to the current source with respect to the resistor.

12. A control method of an image sensor comprising:
controlling a plurality of sample-and-hold circuits to sample and hold a first signal and a second signal output from each of a plurality of different pixels;
controlling each of a plurality of converters, that includes a current source and a resistor connected in series, to convert a potential difference between the first signal and the second signal held in the plurality of sample-and-hold circuits to a current;
controlling a switch to connect/disconnect the plurality of converters; and
controlling, in a case where the switch connects the plurality of converters, to add and output the currents converted by the plurality of converters, and, in a case where the switch disconnects the plurality of converters, to output the currents converted by the plurality of converters independently,
wherein, among the plurality of sample-and-hold circuits, the sample-and-hold circuit that holds the first signal is connected between the current source and the resistor, and the sample-and-hold circuit that holds the second signal is connected on a side opposite to the current source with respect to the resistor.

\* \* \* \* \*